United States Patent
Deng et al.

(10) Patent No.: US 7,746,169 B2
(45) Date of Patent: Jun. 29, 2010

(54) LNA HAVING A POST-DISTORTION MODE AND A HIGH-GAIN MODE

(75) Inventors: Junxiong Deng, San Diego, CA (US); Christian Holenstein, San Diego, CA (US); Namsoo Kim, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/027,107

(22) Filed: Feb. 6, 2008

(65) Prior Publication Data
US 2009/0195310 A1   Aug. 6, 2009

(51) Int. Cl.
*H03F 3/45* (2006.01)
(52) U.S. Cl. .................... 330/254; 330/253
(58) Field of Classification Search ............ 330/254, 330/253, 261, 69
See application file for complete search history.

(56) References Cited

U.S. PATENT DOCUMENTS

| | | | | |
|---|---|---|---|---|
| 4,593,268 | A | * | 6/1986 | Blauschild ............ 341/118 |
| 4,774,475 | A | * | 9/1988 | LaVoie .................. 330/149 |
| 7,245,181 | B2 | * | 7/2007 | Sanduleanu et al. ...... 330/253 |
| 7,301,396 | B1 | | 11/2007 | Johnson et al. |
| 7,352,241 | B2 | | 4/2008 | Lee |
| 2007/0030076 | A1 | | 2/2007 | Namsoo et al. |
| 2007/0229154 | A1 | | 10/2007 | Namsoo et al. |

OTHER PUBLICATIONS

Cabanillas, Jose et al., "Low Noise and Low Input Capacitance Differential MDS LNA," U.S. Appl. No. 11/959,196, filed Dec. 18, 2007.
Che-Sheng Chen et al: "A 2.5GHz 90NM CMOS Triple Gain Mode LNA for WIMAX Applications" Signals Systems and Electronics, 2007. Issue '07. International Symposium on, IEEE, PI, (Jul. 1, 2007), pp. 367-269, XP031129290.
Guochi Huang et al: "Post Linearization of CMOS LNA Using Double Cascode Fets" Circuits and Systems, 2006. ISCAS 2006. Proceedings. 2006 IEEE International Symposium on, IEEE, Piscataway, NJ, USA, (May 21, 2006), pp. 4499-4502, XP010939693.
International Search Report—PCT/US09/033474, International Search Authority—European Patent Office—Apr. 15, 2009.
Written Opinion—PCT/US09/033474, International Search Authority—European Patent Office Apr. 15, 2009.

* cited by examiner

*Primary Examiner*—Henry K Choe
(74) *Attorney, Agent, or Firm*—Ramin Mobarhan

(57) ABSTRACT

A differential low noise amplifier (LNA) is operable in a selectable one of two modes. The LNA includes a first transistor, a second transistor, a third transistor and a fourth transistor. In the first mode (PDC mode), the four transistors are configured to operate as a post-distortion cancellation (PDC) LNA. The third and fourth transistors operate as cancel transistors that improve linearity, but reduce LNA gain somewhat. In the second mode (high gain mode), the third and fourth transistors are configured so that amplified versions of the LNA input signal that they output are added to amplified versions of the LNA input signal that are output by the first and second main transistors, resulting in increased gain. Multiplexing circuits are provided within the LNA so that the LNA is configurable into a selectable one of the two modes by controlling a digital mode control signal supplied to the LNA.

22 Claims, 8 Drawing Sheets

MULTI-MODE PDC LNA

DIFFERENTIAL PDC LNA

DIFFERENTIAL CCMDS LNA

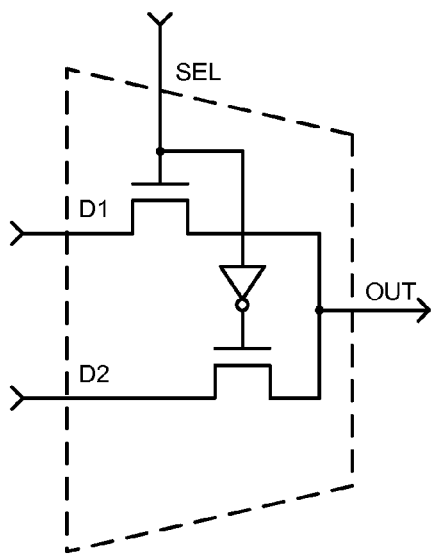
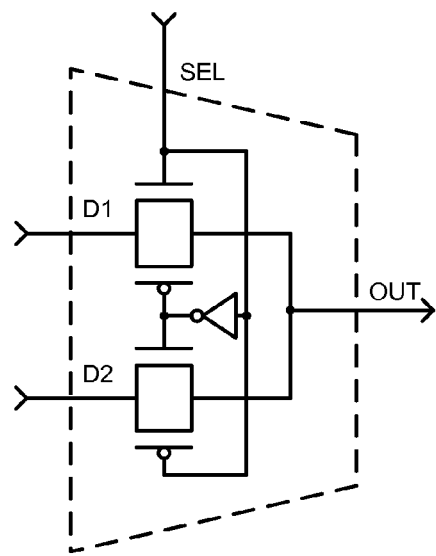
FIG. 6A
FIG. 6B
| MODE | NF (dB) (OF LNA) | GAIN (mS) (OF LNA) | NF (dB) (OF RxFE) | IIP3 (dBm) (OF LNA) | LNA CURRENT(mA) |
|---|---|---|---|---|---|
| PDC - HIGH LINEARITY | 1.35 | 118 | 2 | 10 | 13 |
| LOW NOISE | 1.38 | 132 | 1.84 | 0 | 13 |
PERFORMANCE OF
MULTI-MODE PDC LNA
FIG. 9

PDC MODE

MODE = 0

HIGH GAIN MODE

MODE = 1

ALTERNATIVE EMBODIMENT

LNA HAVING A POST-DISTORTION MODE AND A HIGH-GAIN MODE

BACKGROUND INFORMATION

The disclosed embodiments relate to low noise amplifiers (LNAs).

2. Background Information

The first amplification stage in a radio receiver such as a receiver of a cellular telephone is generally an amplifier circuit called a Low Noise Amplifier (LNA). Measures of LNA operational performance include the noise factor (F) of the LNA and the linearity of the LNA.

The receiver of a cellular telephone includes what is referred to as a receive chain. The receive chain involves a LNA, that outputs a signal to a mixer. The mixer in turn outputs a signal to a baseband filter. The noise factor (F) of the overall receive chain to a first approximation is equal to the noise factor of the LNA plus a quantity, where the quantity is the noise factor of the following stages (the mixer and the baseband filter) divided by the gain of the LNA. Increasing the gain of the LNA therefore decreases the noise factor of the overall receive chain. In a cellular telephone application, there typically are noise factor requirements imposed on the overall receiver. Accordingly, the LNA in a cellular telephone has to have adequate gain to meet noise factor requirements of the overall receiver.

An amplifier, such as the LNA, exhibits an amount of non-linearity. If an ideal sinusoidal input signal of the pure single frequency were supplied to the input of a linear amplifier, then the amplifier would output an amplified version of the input signal. The output signal would have only a single frequency, and this frequency will be the frequency of the input signal. If, however, the same sinusoidal input signal were supplied to the input of an amplifier that exhibits an amount of non-linearity, then the amplifier would output an amplified version of the input signal at the frequency of the input signal, but the amplifier would also output one or more other signals of other frequencies. These other signals are referred to as "distortion". In a practical receiver, these distortion components are often far away from the frequency of the desired signal and can therefore be filtered out of the receiver output signal. If, however, there is another noise signal (referred to here as a jammer) that is received along with the desired signal into the input of the amplifier, then a complex type of distortion sometimes referred to as cross-modulation distortion can occur. Because this cross-modulation distortion may be close in frequency of the frequency of the desired signal, it is difficult or impossible to filter the cross-modulation distortion out of the receiver output signal. If the cross-modulation distortion components cannot be removed from the output signal by filtering, then the amplifier is made to be more linear so that the magnitude of the cross-modulation distortion components is an acceptable amount.

This requirement to have good linearity may, however, only be imposed when the receiver is operating in the presence of a jammer. If it is known that there is no jammer present, then the linearity requirement on the amplifier can be relaxed without the receiver output signal having an unacceptably large amount of distortion because there will be no cross-modulation generated. For example, in some radio communication protocols, the transmitter may be transmitting at the same time that the receiver is receiving. The frequencies of the transmitted signals are close in frequency to the frequencies of the signals being received. Due to the physical proximity of the transmitter and receiver in the cellular telephone handset, and due to the power of the transmitted signal, some of the transmitted signal may leak back into the receiver and constitute a jammer. This particular jammer is, however, only present when the transmitter is transmitting. When the transmitter is not transmitting, the cross-modulation distortion problem is less severe or absent and the linearity requirements on the receiver can be relaxed. In many LNA topologies, the linearity of the amplifier can be increased by increasing the bias current flowing through the LNA. Similarly, the linearity of the amplifier can be reduced by reducing the bias current flowing through the LNA.

FIG. 1 (Prior Art) is a circuit diagram of one particular differential LNA 1 that utilizes the Post-Distortion Cancellation technique (sometimes referred to as the Active Post-Distortion technique). This technique involves the use of four field effect transistors (FETs) 2-5 biased in the saturation region. FETs 2 and 3 are referred to as the main FETs. FETs 4 and 5 are referred to as the cancel FETs. The left-hand pair of main FET 2 and cancel FET 4 operates as follows. Main FET 2 amplifies an input signal received on input lead 6. An amplified version of the input signal is generated onto node 6. Because main FET 2 is configured as a common source amplifier, the amplified signal has a phase shift of approximately 180 degrees with respect to the input signal on input lead 5. Distortion components are also present in the signal on node 6 along with the desired amplified version of the input signal. The phase-shifted signal on node 6 is applied to the gate input of cancel FET 4. Cancel FET 4 is also biased in the saturation region, but it is designed to be a lousy amplifier in that it generates comparatively more of the distortion components in comparison to amplified desired signal than does main FET 2. Due to the way cancel FET 4 receives its input signal, the phase of the input signal supplied to cancel FET 4 is 180 degrees out of phase with respect to the of the input signal supplied to main FET 2. Accordingly, the desired amplified signal as output from cancel FET 4 is 180 degrees out of phase with respect to the desired amplified signal as output from main FET 2, and the phase of the distortion as output from cancel FET 4 is also 180 degrees out of phase with respect to the distortion as output from main FET 2. The signals output from main FET 2 and cancel FET 4 are summed on a merging node 7. If the magnitude of the distortion output by cancel FET 4 is set to be equal in magnitude to the distortion output by main FET 2, then the distortion signals will cancel each other on node 7. At the same time, some of the desired signal output by main FET 2 will be cancelled by the desired signal output by cancel FET 4, but due to the fact that cancel FET 4 is a lousy amplifier some of the desired signal as output from main FET 2 will remain on node 7. This remaining desired signal is the signal output from the PDC LNA. The other complementary pair of main and cancel FETs 3 and 5 works in a similar fashion. Unfortunately, the cancellation of some of the desired signal on the merging nodes 7 and 8 reduces the gain of the PDC LNA.

The PDC LNA of FIG. 1 has a high linearity mode and a low linearity mode. In the high linearity mode, a bias circuit increases the bias voltage on the gates of main FETs 2 and 3. This increases the DC bias current in the LNA and improves linearity. In the low linearity mode, the bias circuit decreases the bias voltage on the gates of main FETs 2 and 3, thereby degrading linearity somewhat but advantageously reducing power consumption. For further details on the active post-distortion cancellation LNA, see: 1) Published U.S. Patent Application No. 2007/0229154, published Oct. 4, 2007, and 2) Published U.S. Patent Application No. 2007/0030076, published Feb. 8, 2007. The input capacitance of the LNA of FIG. 1 is advantageously low because the gate of only one transistor is coupled to each of the input leads 5 and 9. Unfortunately, PDC LNA 1 has less than optimal gain performance due to the cancel transistors canceling some of the desired signals as output by the main transistors.

FIG. 2 is a circuit diagram of another differential LNA 10 that utilizes a variant of the Derivative Super-position (DS) technique referred by here as the Cross-Coupled Modified Derivative Super-position technique (CCMDS). In this circuit, the main FETs 11-14 are biased in the saturation region, but cancel transistors 15 and 16 are biased in the sub-threshold region. When the transconductance equation that describes the output current of a FET amplifier whose FET is biased in the saturation region is compared to the transconductance equation for a FET amplifier whose FET is biased in the sub-threshold region, it is recognized that the signs of the third order coefficients of the transconductance equations of the two transistors are opposite one another. The signs of the first order coefficients, however, are not opposite one another. In the circuit of FIG. 2, this means that biasing a transistor in the sub-threshold region results in a shift in the phase of the third order distortion it outputs as compared to a transistor biased in the saturation region, whereas the phase of the desired signal as output by the sub-threshold biased transistor is not phase shifted as compared to the transistor biased in the saturation region. The current output by cancel FET 15 is supplied onto merging node 17 such that the phase of the desired signal as output by cancel FET 15 is in phase with the desired signal as output by main FET 11. Because the phase of the third order distortion components as output by cancel FET 15 are 180 degrees out of phase with respect to the amplified desired signal as output by cancel FET 15, the third order distortion components as output by cancel FET 15 are 180 degrees out of phase with respect to the third order distortion components as output by main FET 11. If the magnitudes of the third order distortion components in the cancel and main signal paths are set appropriately, then the third order distortion components on merging node 17 will cancel each other. Advantageously, because the phase of the amplified versions of the desired signal as output by the main and cancel FETs are in phase with respect to one another, both the main FET 11 and the cancel FET 15 work together to amplify the desired signal. The CCMDS LNA of FIG. 2 therefore has improved gain characteristics as compared to the post-distortion LNA of FIG. 1.

The CCMDS LNA of FIG. 2 is operable in two modes. A bias circuit controls the DC bias voltage on the gates of the main FETs 11-14. It controls the gate biases such that either transistors 11 and 12 are operating as the main FETs, or such that transistors 13 and 14 are operating as the main FETs. In a high linearity mode, transistors 11 and 12 are employed as the main FETs and transistors 13 and 14 are disabled. The capacitors 19 and 20 capacitively couple the receiver inputs 21 and 22 to the gates of the main transistors 11 and 12, respectively, and operate as capacitive voltage dividers. The input signal received on the inputs 21 and 22 is therefore attenuated so less of the jammer is supplied onto the gates of main FETs 11 and 12. The main FETs 11 and 12 are biased with a higher bias current so that the strong jammer signal will not cause large signal swings in the amplifier and generate more distortion.

In a low linearity mode, transistors 13 and 14 are employed as the main FETs and transistors 11 and 12 are disabled. Capacitors 19 and 20 are not in the signal path. Because there is no strong jammer present to cause the large signal swings in the amplifier that generate more distortion, main FETs 13 and 14 can be biased at lower bias currents in the low linearity mode than main FETs 11 and 12 are biased in the high linearity mode.

Although the CCMDS LNA of FIG. 2 does not suffer the gain degradation of the PDC LNA of FIG. 1 due to the first order transconductance signal components of the cancel path canceling some of the first order transconductance signal component output by the main transistor, the CCMDS LNA of FIG. 2 has other drawbacks. One drawback is that, in addition to the gate of a main transistor being coupled to an input lead, there is an additional capacitor that is coupled to the input lead. This extra capacitor that is coupled to the input lead increases the input capacitance of LNA. To interface the LNA to an antenna, an impedance matching network involving an inductor is typically employed. Increasing the input capacitance of the LNA requires that this inductor in the impedance matching network be larger as well. This is undesirable because providing the larger inductor involves increasing the parasitic resistance of the inductor and thus resulting in noise factor degradation.

A second drawback is that the merging nodes 17 and 18 where the cancel and main signals are combined are the output nodes of the LNA of FIG. 2. As the receiver operates, if the impedance of the circuitry that the LNA drives (for example, the mixer in a receive chain) changes, then this impedance change affects cancellation of the third order distortion between the main and cancel paths. This is undesirable.

SUMMARY

A novel differential low noise amplifier (LNA) is operable in a selectable one of a first mode or a second mode. The LNA includes a first transistor, a second transistor, a third transistor and a fourth transistor. In the first mode (also referred to here as the "PDC mode" or the "high linearity mode"), the LNA has better linearity than it does in the second mode, but in the second mode (also referred to here as the "high gain mode") the LNA has higher gain than it does in the first mode.

In the first mode, the four transistors are configured such that the LNA operates as a differential post-distortion cancellation (PDC) LNA. Each of the first, second, third and fourth transistors is biased in the saturation region. In accordance with the post-distortion cancellation technique, the third transistor generates distortion that is 180 degrees out of phase with respect to distortion generated by the first transistor. The distortion output by the third transistor is summed with the distortion output by the distortion output by the first transistor, thereby canceling the distortion generated by the first transistor. A version of an LNA input signal (the desired signal that is to be amplified by the LNA) that is output by the third transistor also cancels a portion of an amplified version of the desired signal that is output by the first transistor. An uncanceled portion of the amplified version of the desired signal as output by the first transistor remains. This uncanceled portion is communicated to a first output lead of the LNA as an output signal of the LNA. The second and fourth transistors operate in a similar way to the way that the first and third transistors operate in that distortion generated by the fourth transistor is used to cancel distortion output by the second transistor. A version of the desired input signal that is output by the fourth transistor cancels a portion of an amplified version of the desired input signal output by the second transistor, but an uncanceled portion of the amplified version of the desired signal as output by the second transistor remains and is communicated to a second output lead of the LNA. The output signals on the first and second output leads of the LNA constitute a differential output signal of the LNA.

In the second mode, the third transistor generates an amplified version of the desired input signal. This amplified signal is in-phase with an amplified version of the desired input signal that is output by the first transistor. The amplified version of the desired input signal as output by the third transistor is summed with the amplified version of the desired input signal as output by the first transistor, and the resulting signal is communicated to the first output lead of the LNA as an output signal of the LNA. Due to this in-phase relationship, operation of the third transistor contributes to the gain with which the LNA amplifies the desired input signal. Similarly, the fourth transistor generates an amplified version of the desired input signal that is in-phase with an amplified version of the desired input signal that is output by the second transistor. The amplified version of the desired input signal as output by the fourth transistor is summed with the amplified version of the desired input signal as output by the second transistor, and the resulting signal is communicated to the second output lead of the LNA as an output signal of the LNA. The output signals on the first and second output leads of the LNA constitute the differential output signal of the LNA. In one example, the third and fourth transistors are biased in the sub-threshold region in the second mode to reduce power consumption of the LNA.

The LNA includes multiplexing circuits that, if controlled in a first way, couple the first, second, third and fourth transistors so that the LNA is operable in the first mode. If the multiplexing circuits are controlled in a second way, then the multiplexing circuits couple the first, second, third and fourth transistors so that the LNA is operable in the second mode. In one advantageous aspect, the novel LNA is configurable into a selectable one of the first mode and the second mode without loading the LNA input leads with excessive capacitance. In one specific embodiment of the novel LNA, the gate of only one transistor is coupled to each LNA input lead. In another advantageous aspect, the distortion cancellation operation of the novel LNA in the high linearity mode is substantially immune from changes in the input impedance of the circuitry that the LNA drives. The merging nodes upon which the post-distortion cancellation occurs are not the output leads of the LNA, but rather the merging nodes of the LNA are isolated from the output leads by cascode transistors.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIGS. 6A and 6B are circuit diagrams of two exemplary ways that the multiplexing circuits of the novel multi-mode LNA of FIG. 5 can be realized.

FIG. 9 is a chart that sets forth performance parameters for the multi-mode LNA of FIG. 5 when the LNA is operating in the first operating mode and when the LNA is operating in the second operating mode.

DETAILED DESCRIPTION

Figure 3:
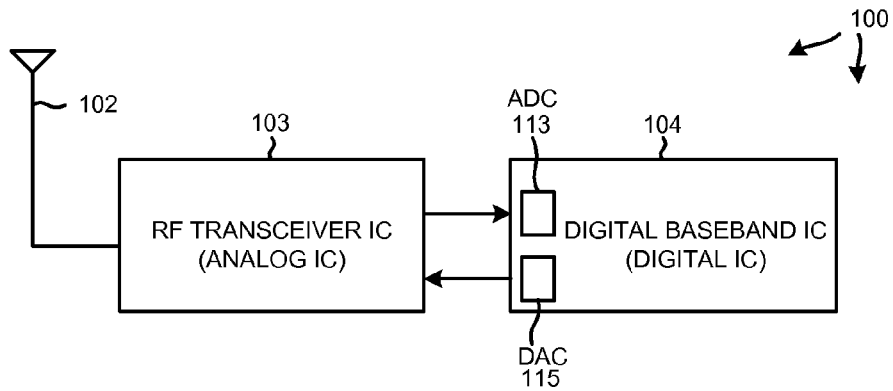
FIG. 3 is a high level block diagram of one particular type of mobile communication device 100 in accordance with one novel aspect.

FIG. 3 is a very simplified high level block diagram of one particular type of mobile communication device 100 in accordance with one novel aspect. In this example, mobile communication device 100 is a 3G cellular telephone that uses the CDMA2000 cellular telephone communication protocol. The cellular telephone includes (among several other parts not illustrated) an antenna 102 and two integrated circuits 103 and 104. Integrated circuit 104 is called a "digital baseband integrated circuit" or a "baseband processor integrated circuit". Integrated circuit 103 is an RF transceiver integrated circuit. RF transceiver integrated circuit 103 is called a "transceiver" because it includes a transmitter as well as a receiver.

Figure 4:
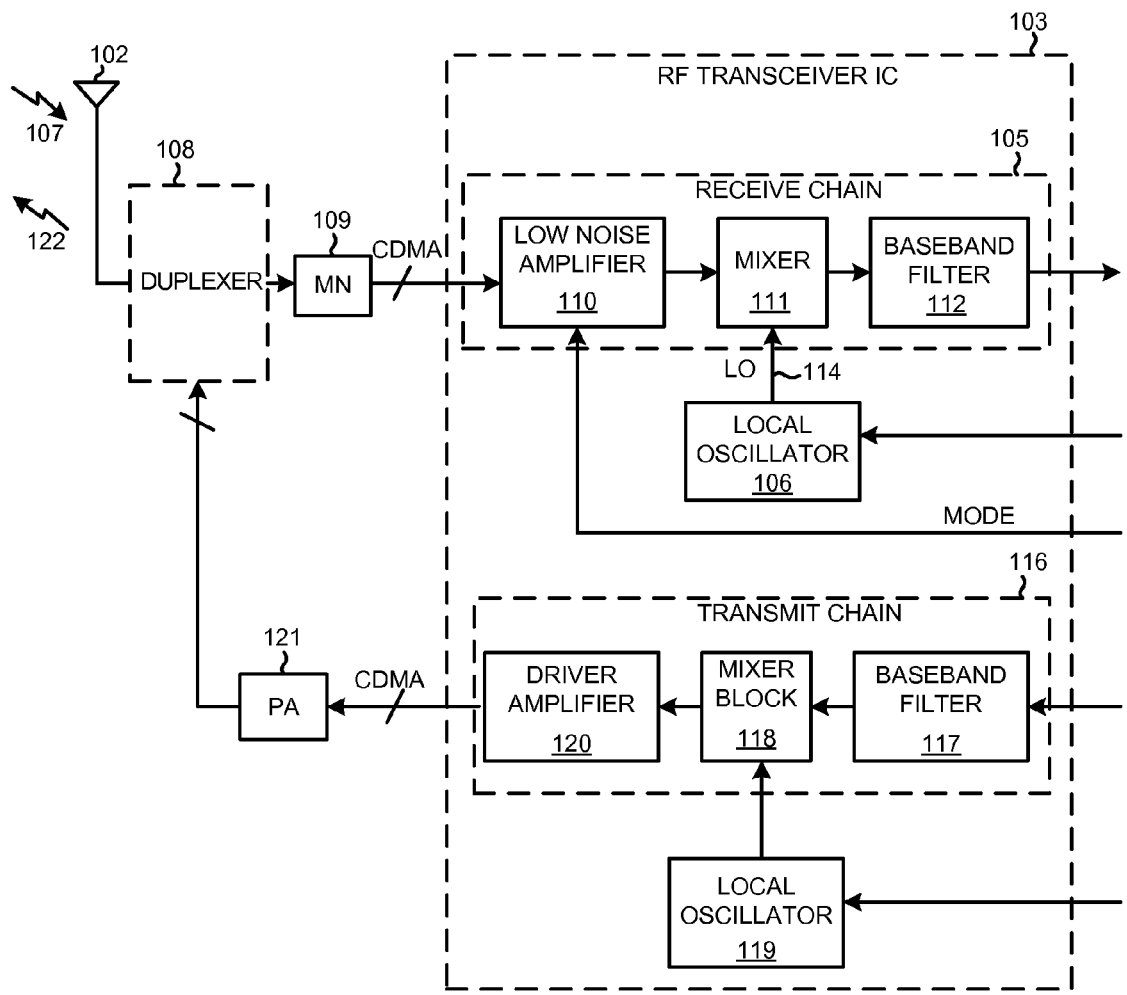
FIG. 4 is a more detailed block diagram of the RF transceiver integrated circuit 103 in the mobile communication device of FIG. 1.

FIG. 4 is a more detailed block diagram of the RF transceiver integrated circuit 103. The receiver includes what is called a "receive chain" 105 as well as a local oscillator (LO) 106. When the cellular telephone is receiving, a high frequency RF signal 107 is received on antenna 102. Information from signal 107 passes through duplexer 108, matching network 109, and through the receive chain 105. Signal 107 is amplified by low noise amplifier (LNA) 110 and is down-converted in frequency by mixer 111. The resulting down-converted signal is filtered by baseband filter 112 and is passed to the digital baseband integrated circuit 104. An analog-to-digital converter 113 in the digital baseband integrated circuit 104 converts the signal into digital form and the resulting digital information is processed by digital circuitry in the digital baseband integrated circuit 104. The digital baseband integrated circuit 104 tunes the receiver by controlling the frequency of the local oscillator signal (LO) 114 supplied by local oscillator 106 to mixer 111.

If the cellular telephone is transmitting, then information to be transmitted is converted into analog form by a digital-to-analog converter 115 in the digital baseband integrated circuit 104 and is supplied to a "transmit chain" 116. Baseband filter 117 filters out noise due to the digital-to-analog conversion process. Mixer block 118 under control of local oscillator 119 then up-converts the signal into a high frequency signal. Driver amplifier 120 and an external power amplifier 121 amplify the high frequency signal to drive antenna 102 so that a high frequency RF signal 122 is transmitted from antenna 102.

Figure 5:
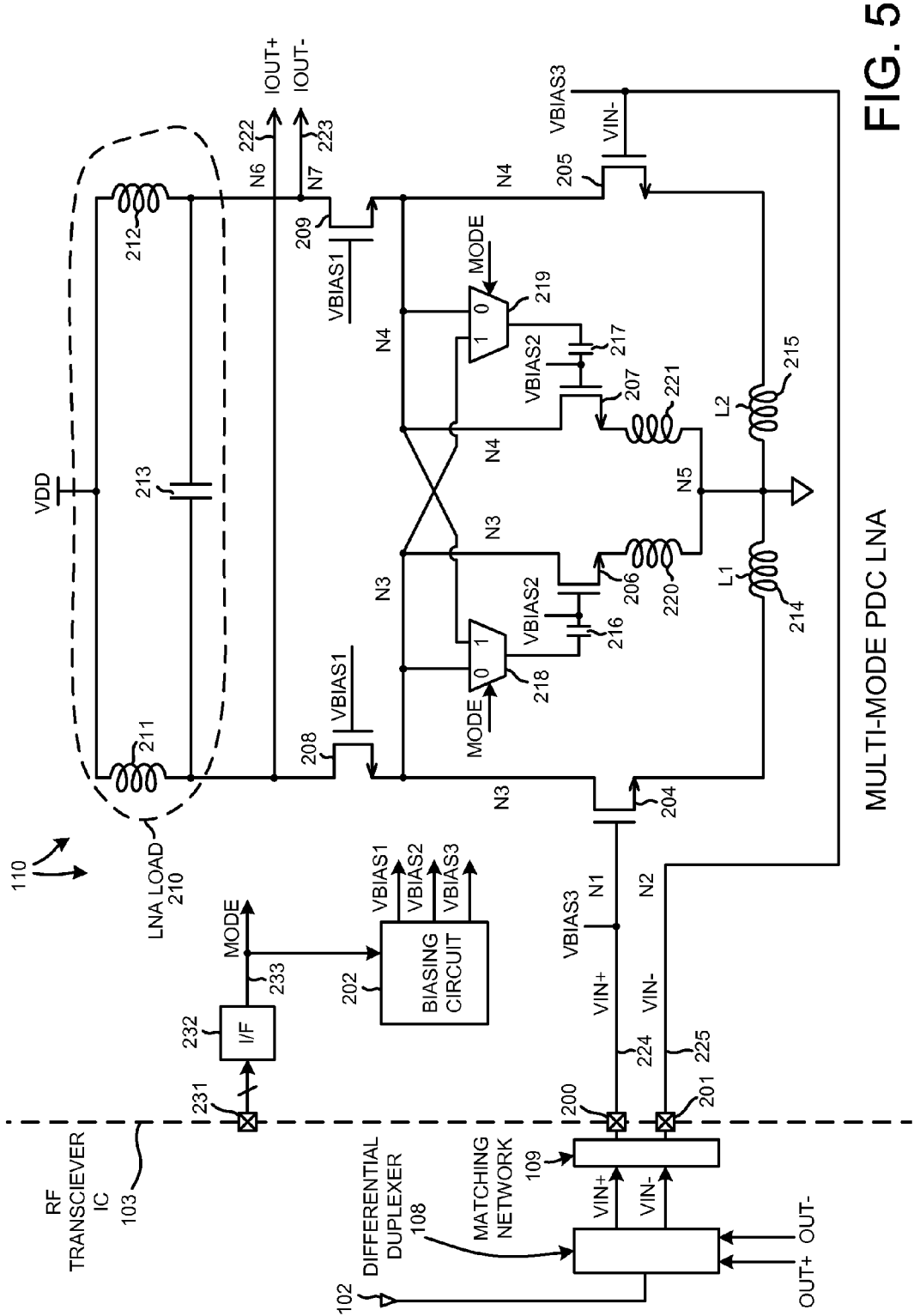
FIG. 5 is a circuit diagram of the novel multi-mode LNA 110 in the RF transceiver integrated circuit 103 of FIG. 4.

FIG. 5 is a circuit diagram that shows LNA 110 in further detail. LNA 110 includes two differential input signal terminals 200 and 201, a biasing circuit 202, a first field effect transistor (FET) 204, a second FET 205, a third FET 206, a fourth FET 207, a first cascode transistor 208, a second cascode transistor 209, an LNA load 210 including two inductors 211 and 212 and a capacitor 213, a first degeneration inductor L1 214, a second degeneration inductor L2 215, two capacitors 216 and 217, two multiplexing circuits 218 and 219, two optional degeneration inductors 220 and 221, and two differential output signal nodes 222 and 223. All transistors 204-209 are N-channel FETs. First and second FETs 204 and 205 are also referred to as the main transistors, and third and fourth FETs 206 and 207 are also referred to as the cancel transistors. Inductors 214, 215, 220 and 221 and capacitors 216 and 217 are integrated components formed on RF transceiver integrated circuit 103 using semiconductor fabrication processes.

In addition, RF transceiver integrated circuit 103 includes one or more serial bus terminals 231 and associated serial bus interface logic 232. Serial bus terminals 231 in this example are coupled by an SPI serial bus to digital baseband integrated circuit 104 (see FIG. 3). Digital baseband integrated circuit 104 communicates mode control information across this SPI bus, through interface logic 232, and to LNA 110 via signal conductor 233. The mode control information is present on signal conductor 233 in the form of a digital signal. If the digital mode control signal has a digital logic low value then LNA 110 is controlled to operate in a first operating mode, whereas if the digital mode control signal has a digital logic high value then LNA 110 is controlled to operate in a second operating mode.

Biasing circuit 202 supplies a DC bias voltage VBIAS1 onto the gates of cascode FETs 208 and 209, and also supplies a DC bias voltage VBIAS2 onto the gates of third and fourth FETs 216 and 217, and also supplies a DC bias voltage VBIAS3 onto the gates of first and second FETs 204 and 205. VBIAS2 is set such that the third and fourth FETs 206 and 207 are biased in the saturation region when the LNA is operating in the first operating mode, and are biased in the sub-threshold region when the LNA is operating in the second operating mode. The sub-threshold operating region is sometimes referred to as the weak inversion operating region. VBIAS3 is set such that the first and second FETs 204 and 205 are biased in the saturation operating region.

FIGS. 6A and 6B are circuit diagrams that set forth two ways that the multiplexing circuits 218 and 219 of FIG. 5 can be realized. In the example of FIG. 6A, the multiplexing circuits are N-channel analog multiplexers. In the example of FIG. 6B, the multiplexing circuits are transmission gate analog multiplexers.

Figure 7:
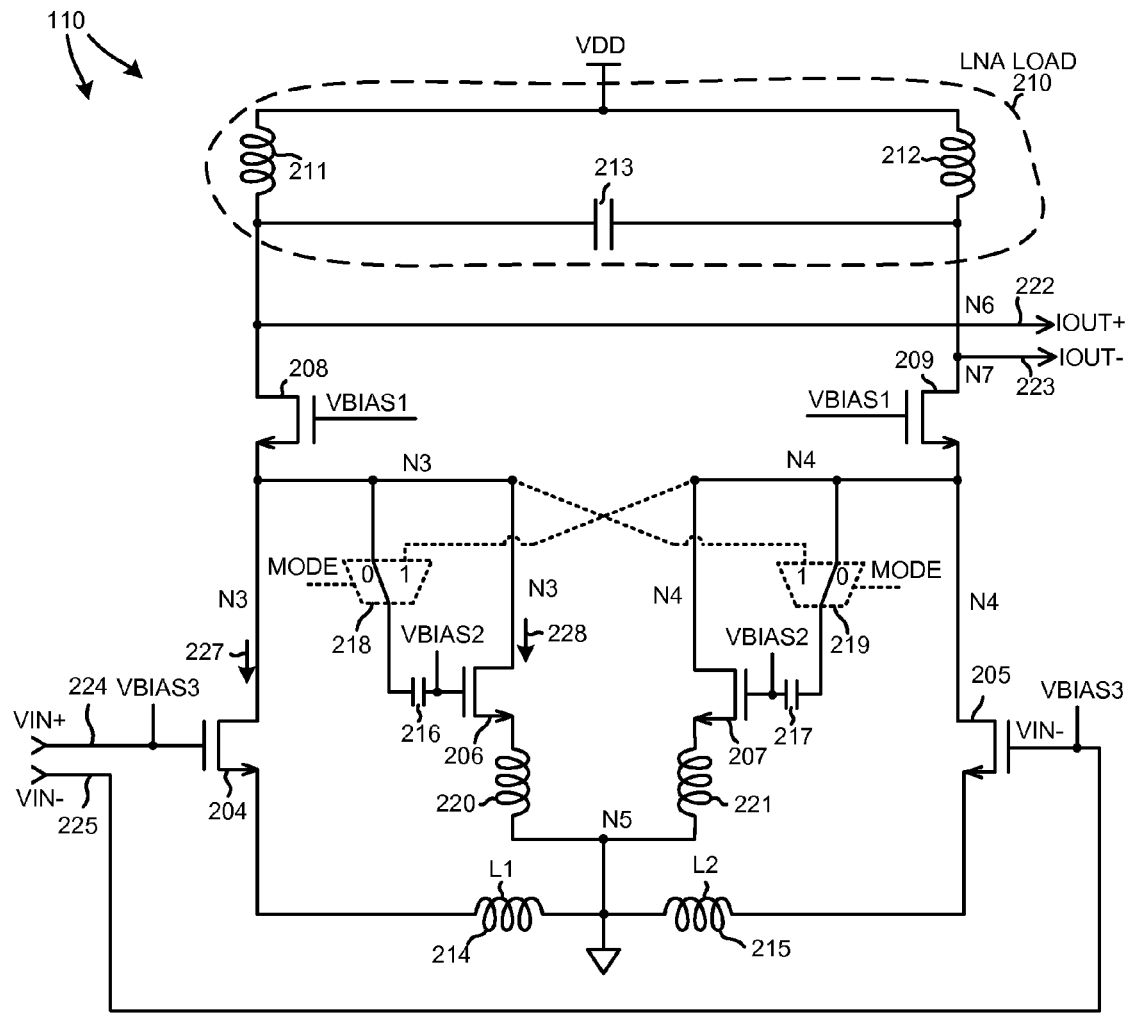
FIG. 7 is a diagram that illustrates how the novel multi-mode LNA of FIG. 5 is configured and operates in the first operating mode.

PDC Mode:

FIG. 7 illustrates an operation of the novel LNA circuit 110 of FIG. 5 in the first operating mode referred to here as the "PDC mode" or the "high linearity mode". To put LNA 110 into this mode, the digital mode control signal MODE is set to have a digital logic low value. This digital logic low signal is supplied onto the select input leads of multiplexing circuits 218 and 219 as shown. Multiplexing circuit 218 capacitively couples the drain of first FET 204 at node N3 to the gate of third transistor 206. The drain of second transistor 205 at node N4 is decoupled from the gate of third transistor 206. Likewise, multiplexing circuit 219 capacitively couples the drain of second FET 205 at node N4 to the gate of fourth transistor 207. The drain of first transistor 204 at node N3 is decoupled from the gate of fourth transistor 207. In this configuration, the first, second, third and fourth transistors are configured and interconnected to form a post-distortion cancellation (PDC) LNA.

For a detailed mathematical explanation of the operation of active post-distortion cancellation, see: 1) Published U.S. Patent Application No. 2007/0229154, published Oct. 4, 2007, and 2) Published U.S. Patent Application No. 2007/0030076, published Feb. 8, 2007. A somewhat simplified conceptual explanation of post-distortion cancellation is set forth below.

All four FETs 204-207 are biased in the saturation region. The left-hand pair of main FET 204 and cancel FET 206 operates as follows. Main FET 204 amplifies an input signal received on input lead 224. An amplified version of the input signal is generated onto node N3. Because main FET 204 is configured as a common source amplifier, the amplified signal has a phase shift of approximately 180 degrees with respect to the input signal on input lead 224. Distortion components are also present on node N3 along with the desired amplified version of the input signal. Arrow 227 in FIG. 7 represents the amplified version of the input signal along with the distortion components. The phase-shifted signal on node N3 is applied through multiplexing circuit 218 and capacitor 216 onto the gate input of cancel FET 206.

Cancel FET 206 is also biased in the saturation region, but it is designed to be a lousy amplifier in that it generates comparatively more of the distortion components in comparison to the amplified desired signal than does main FET 204. Arrow 228 in FIG. 7 represents the amplified version of the desired signal and the distortion components output by third FET 206. Due to the way cancel FET 206 receives its input signal from node N3, the phase of the desired amplified signal as output from cancel FET 206 is 180 degrees out of phase with respect to the desired amplified signal as output from main FET 204, and the phase of the distortion components as output from cancel FET 206 are also 180 degrees out of phase with respect to distortion components as output from main FET 204. The signals output from main FET 204 and cancel FET 206 are summed on merging node N3. If the magnitude of the distortion components output by cancel FET 206 is set to be equal in magnitude to the distortion components output by main FET 204, then the distortion components will cancel each other on merging node N3. In accordance the post-distortion cancellation technique, some of the desired signal output by the main FET 204 will be cancelled at the same time by the desired signal output by cancel FET 206, but due to the fact that cancel FET 206 is a lousy amplifier, some of the desired signal as output from main FET 204 will remain on merging node N3. This remaining desired signal is the signal that is output through cascode transistor 208 and onto differential output node 222, and from the PDC LNA 110. The other complementary pair of main and cancel FETs 205 and 207 works in a similar fashion and outputs an amplified version of the desired signal onto differential output node 223.

Figure 8:
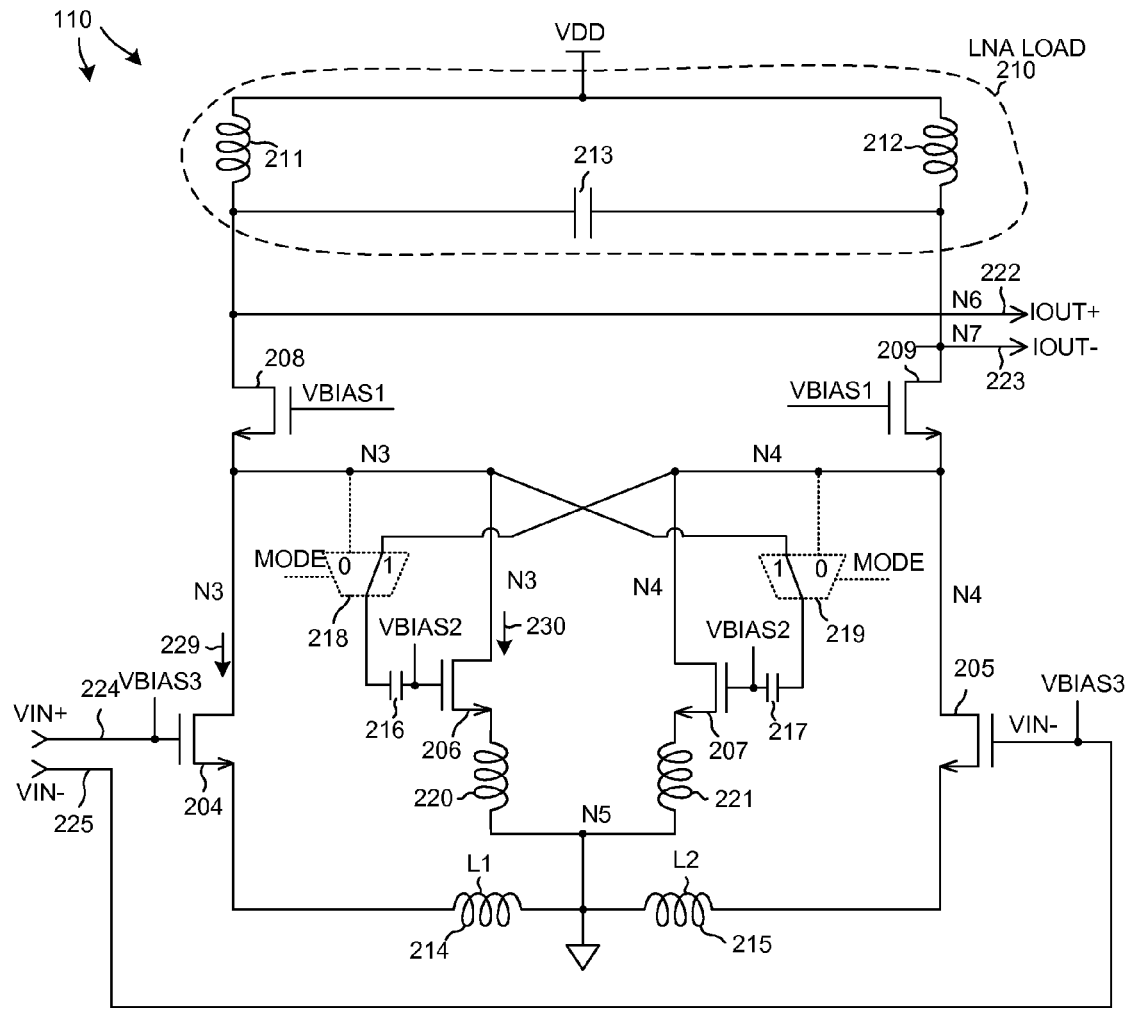
FIG. 8 is a diagram that illustrates how the novel multi-mode LNA of FIG. 5 is configured and operates in the second operating mode.

High Gain Mode:

FIG. 8 illustrates an operation of the novel LNA circuit 110 of FIG. 5 in the second operating mode referred to here as the "high gain mode". To put the LNA 110 into this mode, the digital mode control signal MODE is set to have a digital logic high value. This digital logic high signal is supplied onto the select input leads of multiplexing circuits 218 and 219 as shown. Multiplexing circuit 218 capacitively couples the drain of second FET 205 at node N4 to the gate of third transistor 206. The drain of first transistor 204 at node N3 is decoupled from the gate of third transistor 206. Likewise, multiplexing circuit 219 capacitively couples the drain of first FET 204 at node N3 to the gate of fourth transistor 207. The drain of second transistor 205 at node N4 is decoupled from the gate of fourth transistor 207.

In this high gain configuration, the primary use of the third and fourth FETs 206 and 207 is not to cancel distortion output by the first and second FETs 204 and 205, but rather the primary purpose is to supplement the amplified desired signals as output by the first and second main FETs 204 and 205 in order to increase LNA gain.

This operation is described in further detail in connection with first FET 204 and third FET 206. First FET 204 is biased in the saturation region and is configured as in the first operating mode as a common source amplifier. Because main FET 204 is configured as a common source amplifier, the amplified version of the desired signal as output onto the drain of FET 204 has a phase shift of approximately 180 degrees with respect to the input signal on input lead 224. Distortion components are also present on node N3 along with the desired amplified version of the input signal. Arrow 229 represents the amplified version of the desired input signal along with the distortion components.

Unlike the first operating mode in which the phase of the desired signal on the gate of third FET 206 is 180 degrees out of phase with respect to the desired signal on the gate of first FET 204, in the second operating mode the phase of the desired signal on the gate of third FET 206 is in-phase with respect to the desired signal on the gate of first FET 204. This is so because the desired signal VIN– on the second differential input lead 225 is 180 degrees out of phase with respect to the desired signal VIN+ on the first differential input lead 224. The signal VIN– is then amplified by the common source amplifier involving second FET 205 so that the version of the desired signal on the drain of the second FET 205 is phased-shifted by another 180 degrees. The version of the desired signal on node N4 is therefore back in-phase with respect with the desired signal VIN+ on the first differential input lead 224. This desired signal on the drain of second FET 205 is supplied via multiplexing circuit 218 and capacitor 216 onto the gate of third FET 206.

Arrow 230 in FIG. 8 represents the desired signal and distortion components on the drain of third FET 206. Because the phases of the desired signals on the gates of the first and third FETs 204 and 206 are the same, the phase of the amplified version of the desired signal as output by third FET 206 is in-phase with the phase of the amplified version of the desired signal as output by first FET 204. The two versions of the desired signal therefore sum on merging node N3. The desired signal on node N3 is supplied through cascode FET 208 onto the first differential output node 222. Third FET 206 is therefore seen to increase the signal gain of the LNA. Second and fourth FETs 205 and 207 work in a similar fashion to the way described above that FETs 204 and 206 work. Fourth FET 207 outputs a version of the desired signal that is in-phase with the amplified version of the desired signal as output by second FET 205.

Because the phase of the linear component of the transconductance equation that describes the output current signal of a common source amplifier is the same, regardless of whether the transistor is biased in the saturation region or is biased in the sub-threshold region, the third and fourth FETs 206 and 207 can be biased in either the saturation region or the sub-threshold region. In the example of FIG. 8, the third and fourth FETs 206 and 207 are biased in the sub-threshold regions because biasing these transistors in the sub-threshold region reduces LNA current consumption as compared to the same circuit in which the third and fourth FETs 206 and 207 are biased in the saturation region.

Representative Performance:

FIG. 9 is a table that sets forth representative performance characteristics of the multi-mode LNA 110 of FIG. 5. In the PDC mode (MODE=0), LNA 110 has an IIP3 intercept point of 10 dBm as compared to an IIP3 intercept point of 0 dBm in the high gain mode (MODE=1). In the high gain mode, LNA 110 has a gain of 132 mS as compared to a gain of 118 mS in the high linearity mode. By increasing the gain of the LNA within a receive chain, the overall noise figure of the receive chain is improved. The NF (OF LNA) column in the table indicates the noise figure of the LNA, whereas the NF (OF RXFE) column in the table indicates the noise figure of the overall receive chain of which the LNA is a part.

Figure 2:
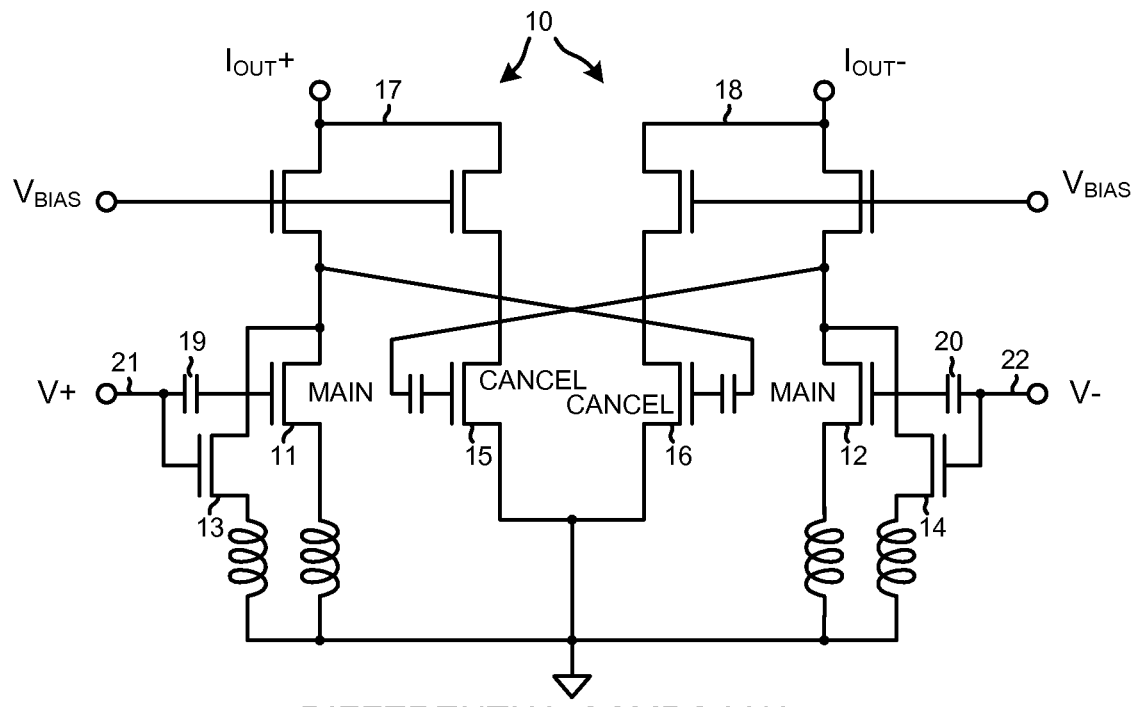
FIG. 2 is a diagram of an LNA referred to as a cross-coupled modified derivative superposition (CCMDS) LNA.

In one advantageous aspect, the novel multi-mode LNA 110 is configurable into a selectable one of the first mode and the second mode without loading the LNA input leads with excessive capacitance. In the specific embodiment illustrated in FIG. 5, the gate of only one transistor is coupled to each LNA input lead. There is only one transistor, FET 204, whose gate is coupled to LNA input lead 224. There is only one transistor, FET 205, whose gate is coupled to LNA input lead 225. The resulting reduced capacitance on the input leads 224 and 225 is an advantage over the multi-mode CCMDS LNA of FIG. 2.

In another advantageous aspect, the distortion cancellation operation of the novel LNA 110 in the high linearity mode is substantially immune from changes in the input impedance of the circuitry that the LNA drives. The merging nodes upon which the post-distortion cancellation occurs are not the output leads of the LNA, but rather the output leads of the LNA are isolated by cascode transistors. The relative immunity of the cancellation to changes in load impedance is a further advantage over the multi-mode CCMDS LNA of FIG. 2 in which the merging nodes are the output nodes of the LNA.

Figure 1:
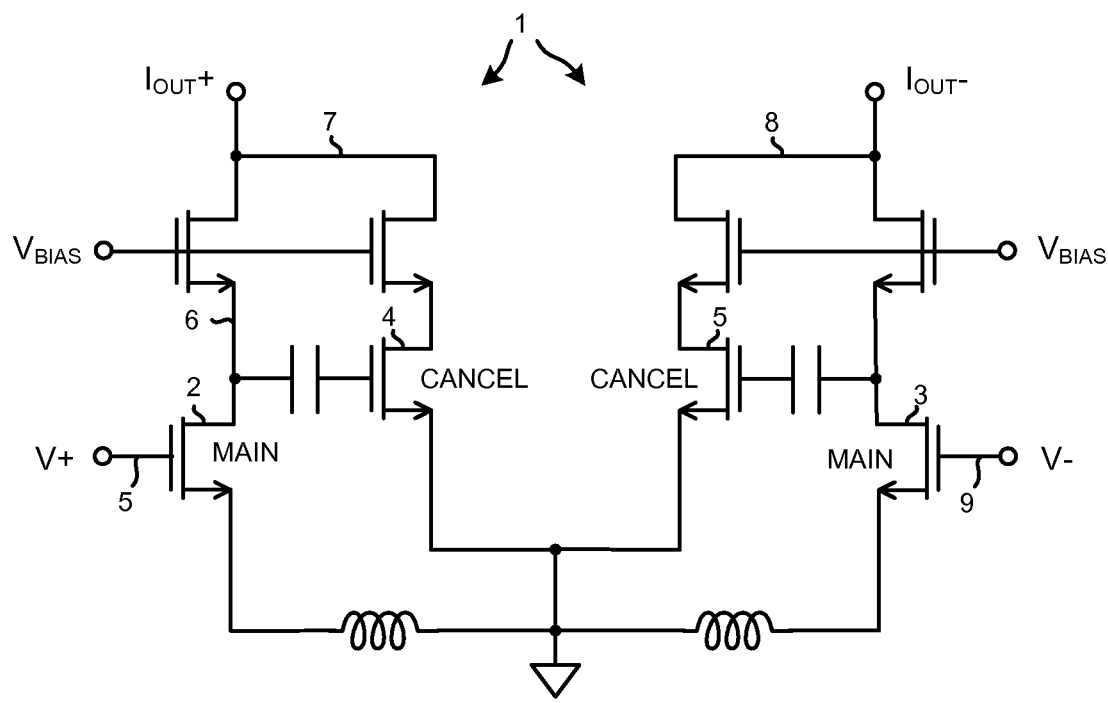
FIG. 1 (Prior Art) is a diagram of a conventional differential active post-distortion LNA.

The conventional PDC LNA of FIG. 1 has a high linearity mode and a low input capacitance on its LNA input leads. In its other operating mode (other than the high linearity mode), however, the conventional PDC LNA of FIG. 1 has relatively poor gain performance at least in part because its cancel transistors cancel some of the desired signal being output by its main transistors. The novel multi-mode LNA 110 of FIG. 5 is superior to the conventional PDC LNA of FIG. 1 in at least one aspect in that the high gain mode, the third and fourth FETs 206 and 207 contribute to LNA gain. Moreover, supporting these two operational modes is accomplished without adding capacitive loading to the LNA input leads as described above.

Figure 10:
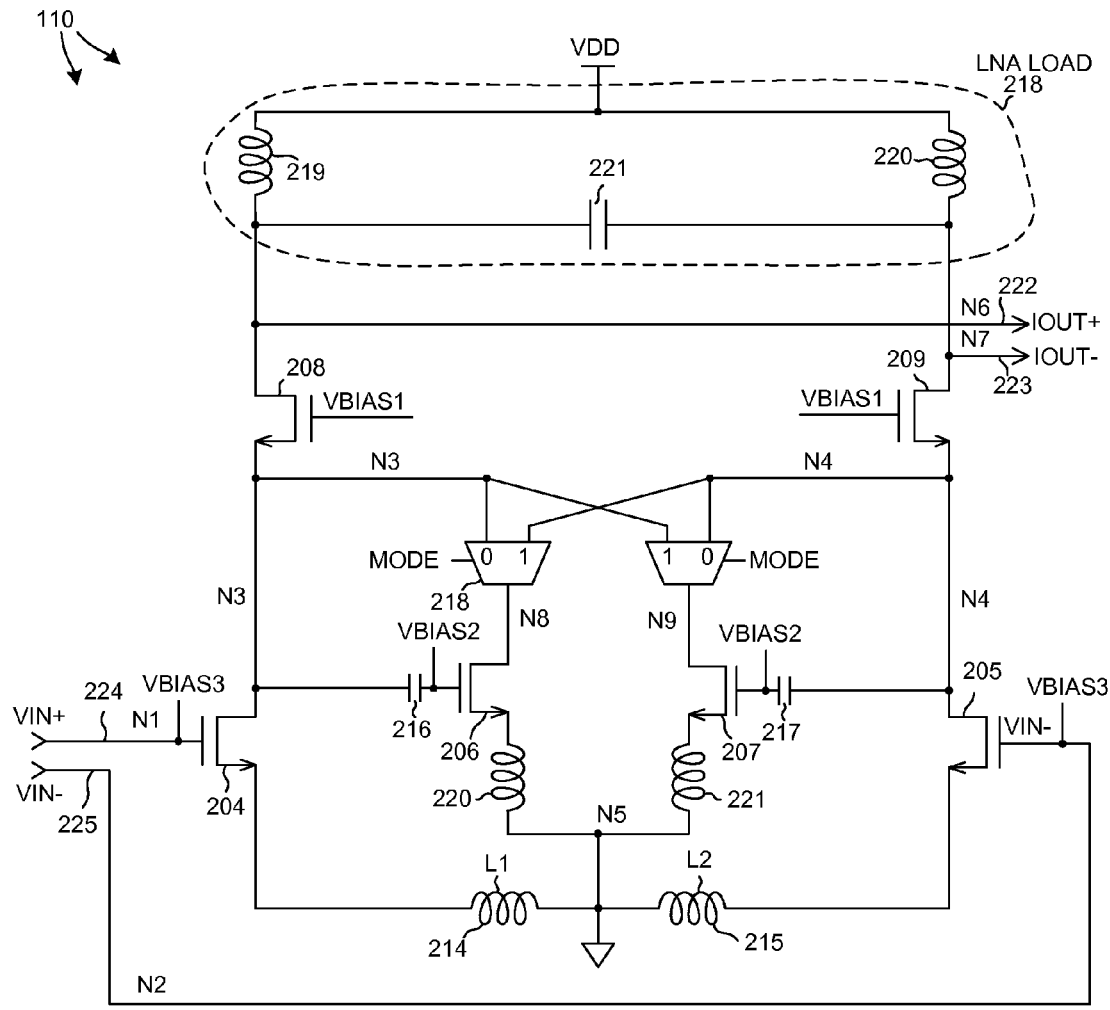
FIG. 10 is a diagram of an alternative embodiment of the multi-mode LNA 110 of FIG. 4.

FIG. 10 is a diagram of an alternative embodiment of the novel multi-mode LNA 110 of FIG. 4. The gate of third FET 206 is capacitively coupled to the drain of first FET 204. Multiplexing circuit 218, which in this case is a de-multiplexer, couples the drain of second FET 206 to a selectable one of the drain of first FET 204 or the drain of second FET 205. The gate of fourth FET 207 is capacitively coupled to the drain of second FET 205. Multiplexing circuit 219, which in this case is a de-multiplexer, couples the drain of fourth FET 207 to a selectable one of the drain of second FET 205 or the drain of first FET 204.

Figure 11:
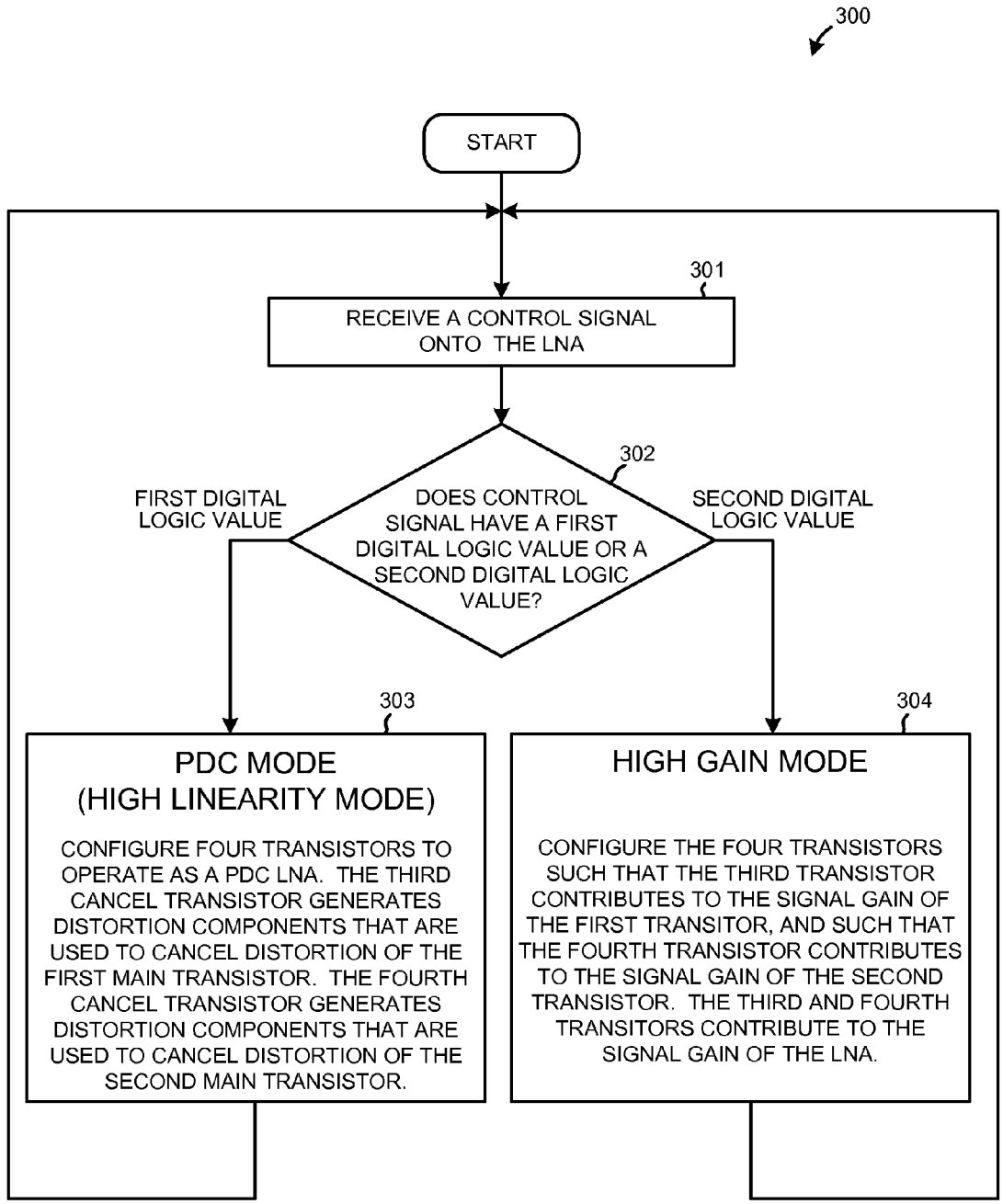
FIG. 11 is a flowchart of a novel method.

FIG. 11 is a simplified flowchart of a method 300 in accordance with one novel aspect. A digital logic control signal is received (step 301) onto an LNA. The LNA involves four transistors. If the control signal has a first digital logic value (as determined in step 302), then the four transistors are configured to operate as a PDC LNA. A third of the transistors generates distortion components that are used to cancel distortion generated by a first of the transistors in accordance with the post-distortion cancellation technique. Similarly, a fourth of the transistors generates distortion components that are used to cancel distortion generated by a second of the transistors in accordance with the post-distortion cancellation technique.

If, however, the control signal has a second digital logic value (as determined in step 302), then the four transistors are configured to operate in a high gain mode. The third transistor outputs an amplified version of the desired signal and this output is added to the amplified version of the desired signal as output by the first transistor. Similarly, the fourth transistor outputs an amplified version of the desired signal and this output is added to the amplified version of the desired signal as output by the second transistor. The third and fourth transistors contribute to the gain of the LNA. The LNA can be switched back and forth between the PDC mode and the high gain mode by changing the digital logic value of the control signal. In one example, a digital baseband IC (for example, IC 104 in FIG. 3) controls which of the two modes the LNA is operating in by sending control information across a bus to an RF transceiver IC (for example, IC 103 in FIG. 3). Bus interface logic (for example, block 232 in FIG. 5) in the RF transceiver IC receives the control information and supplies it to the LNA in the form of the digital control signal (for example, see signal MODE in FIG. 5).

Although certain specific embodiments are described above for instructional purposes, the teachings of this patent document have general applicability and are not limited to the specific embodiments described above. Accordingly, various modifications, adaptations, and combinations of the various features of the described specific embodiments can be practiced without departing from the scope of the claims that are set forth below.

What is claimed is:

1. A low noise amplifier (LNA) having a first differential input node and a second differential input node, the LNA comprising:
   a first transistor biased in the saturation region, wherein a gate of the first transistor is coupled to the first differential input node, wherein the first transistor generates a first distortion signal onto a drain of the first transistor;
   a second transistor biased in the saturation region, wherein a gate of the second transistor is coupled to the second differential input node, wherein the second transistor generates a second distortion signal onto a drain of the second transistor;
   a third transistor having a gate that is switchably selectively couplable to either a drain of the first transistor or to a drain of the second transistor; and
   a fourth transistor having a gate that is switchably selectively couplable to either the drain of the second transistor or to the drain of the first transistor.

2. The LNA of claim 1, further comprising:
   a first differential output node;
   a fifth transistor having a drain coupled to the first differential output node and having a source that is coupled to the drain of the first transistor;
   a second differential output node; and
   a sixth transistor having a drain coupled to the second differential output node and having a source that is coupled to the drain of the second transistor.

3. The LNA of claim 1, further comprising:
   a first multiplexing circuit having a first signal input node, a second signal input node, a signal output node, and a select input node, wherein the first signal input node is coupled to the drain of the first transistor, wherein the second signal input node is coupled to the drain of the second transistor, wherein the signal output node is capacitively coupled to the gate of the third transistor; and
   a second multiplexing circuit having a first signal input node, a second signal input node, a signal output node, and a select input node, wherein the first signal input node is coupled to the drain of the second transistor, wherein the second signal input node is coupled to the drain of the first transistor, wherein the signal output node is capacitively coupled to the gate of the fourth transistor.

4. The LNA of claim 1, wherein the drain of the first transistor is directly connected to the drain of the third transistor, and wherein the drain of the second transistor is directly connected to the drain of the fourth transistor.

5. The LNA of claim 2, further comprising:
   a first inductor having a first lead and a second lead, the first lead being coupled to a source of the first transistor, the second lead being coupled to a common node; and
   a second inductor having a first lead and a second lead, the first lead being coupled to a source of the second transistor, the second lead being coupled to the common node.

6. The LNA of claim 5, wherein a source of the third transistor is coupled to the common node, and wherein a source of the fourth transistor is coupled to the common node.

7. The amplifier of claim 5, wherein a source of the third transistor is coupled to the common node through a third inductor, and wherein a source of the fourth transistor is coupled to the common node through a fourth inductor.

8. The amplifier of claim 1, wherein the amplifier receives a digital signal, wherein if the digital signal has a first digital value then the gate of the third transistor is capacitively coupled the drain of the first transistor, wherein if the digital signal has a second digital value then the gate of the third transistor is capacitively coupled to the drain of the second transistor, wherein if the digital signal has the first digital value then the gate of the fourth transistor is capacitively coupled the drain of the second transistor, wherein if the digital signal has the second digital value then the gate of the third transistor is capacitively coupled to the drain of the first transistor.

9. The amplifier of claim 8, wherein if the amplifier is operating and the digital signal has the first digital value then the third and fourth transistors are biased in the saturation region, whereas if the amplifier is operating and the digital signal has the second digital value then the third and fourth transistors are biased in the sub-threshold region.

10. A differential low noise amplifier (LNA) that receives a desired signal, the LNA comprising:
    a first transistor biased in the saturation region, wherein the first transistor generates a first amplified version of the desired signal and a first distortion signal;
    a second transistor biased in the saturation region, wherein the second transistor generates a second amplified version of the desired signal and a second distortion signal;
    a third transistor;
    a fourth transistor; and
    means for configuring the first, second third and fourth transistors together such that the LNA operates in a selectable one of two modes, wherein in a first of the two modes post-distortion cancellation is utilized to cancel at least some of the first and second distortion signals, and wherein in a second of the two modes the third transistor generates a third amplified version of the desired signal that is in-phase with the first amplified version of the desired signal and is summed with the first amplified version of the desired signal, and wherein in the second of the two modes the fourth transistor generates a fourth amplified version of the desired signal that is in-phase with the second amplified version of the desired signal and is summed with the second amplified version of the desired signal.

11. The LNA of claim 10, wherein the means comprises a first multiplexer and a second multiplexer, wherein an output lead of the first multiplexer is capacitively coupled to a gate of the third transistor, and wherein an output lead of the second multiplexer is capacitively coupled to a gate of the fourth transistor.

12. The LNA of claim 10, wherein the means comprises a first multiplexer and a second multiplexer, wherein an output lead of the first multiplexer is coupled to a drain of the third transistor, and wherein an output lead of the second multiplexer is coupled to a drain of the fourth transistor.

13. The LNA of claim 10, wherein in the first mode a gate of the third transistor is capacitively coupled to a drain of the first transistor, wherein in the first mode a gate of the fourth transistor is capacitively coupled to a drain of the second transistor, wherein in the second mode the gate of the third transistor is capacitively coupled to the drain of the second transistor, and wherein in the second mode the gate of the fourth transistor is capacitively coupled to the drain of the first transistor.

14. The LNA of claim 10, wherein the LNA receives a digital logic signal, wherein if the digital logic signal has a first digital logic value then the LNA is configured in the first mode whereas if the digital logic signal has a second digital logic value then the LNA is configured in the second mode.

15. A method comprising:
 (a) receiving a control signal;
 (b) if the control signal received in (a) has a first digital logic value then coupling a first transistor, a second transistor, a third transistor and a fourth transistor of a low-noise amplifier (LNA) together such that the LNA operates as a post-distortion cancellation LNA, wherein when the LNA operates as the post-distortion cancellation LNA the third transistor generates distortion that cancels distortion generated by the first transistor, and wherein when the LNA operates as the post-distortion cancellation LNA the fourth transistor generates distortion that cancels distortion generated by the second transistor; and
 (c) if the control signal received in (a) has a second digital logic value then coupling the first, second, third and fourth transistors together such that the third transistor contributes to the gain of the LNA and such that the fourth transistor contributes to the gain of the LNA.

16. The method of claim 15, wherein if the control signal has the second digital logic value then the first transistor outputs a first amplified version of an LNA input signal, the third transistor outputs a third amplified version of the LNA input signal that is in-phase with the first amplified version of the LNA input signal, and the third amplified version of the LNA input signal is added to the first amplified version of the LNA input signal, and wherein if the control signal has the second digital logic value then the second transistor outputs a second amplified version of an LNA input signal, the fourth transistor outputs a fourth amplified version of the LNA input signal that is in-phase with the second amplified version of the LNA input signal, and the fourth amplified version of the LNA input signal is added to the second amplified version of the LNA input signal.

17. The method of claim 16, further comprising:
 (d) operating the LNA for a first period of time when the control signal has the first digital logic value, and then operating the LNA for a second period of time when the control signal has the second digital logic value.

18. The method of claim 15, wherein if the LNA is operating and the control signal has the first digital logic value then the first, second, third and fourth transistors are biased in the saturation region, whereas if the LNA is operating and the control signal has the second digital logic value then the first and second transistors are biased in the saturation region and the third and fourth transistors are biased in the sub-threshold region.

19. A method comprising:
 providing a low-noise amplifier (LNA) that is configurable to operate in a switchably selectable one of two modes, wherein in the first mode the LNA employs a post-distortion cancellation technique to cancel distortion generated in the LNA, wherein the LNA has exhibits a signal first gain when the LNA is operating in the first mode, wherein in the second mode the LNA has a second gain that is higher than the first gain, and wherein in the second mode the LNA is less linear that it is when the LNA is operating in the first mode.

20. The method of claim 19, wherein the LNA includes a first transistor, a second transistor, a third transistor and a fourth transistor, wherein if the LNA is operating in the first mode then a gate of the third transistor is capacitively coupled to a drain of the first transistor and a gate of the fourth transistor is capacitively coupled to a drain of the second transistor, wherein if the LNA is operating in the second mode then the gate of the third transistor is capacitively coupled to a drain of the second transistor and a gate of the fourth transistor is capacitively coupled to a drain of the first transistor.

21. The method of claim 19, wherein the LNA includes a first transistor, a second transistor, a third transistor and a fourth transistor, wherein if the LNA is operating in the first mode then a drain of the third transistor is coupled to a drain of the first transistor and a drain of the fourth transistor is coupled to a drain of the second transistor, wherein if the LNA is operating in the second mode then the drain of the third transistor is capacitively coupled to a drain of the second transistor and a drain of the fourth transistor is capacitively coupled to a drain of the first transistor.

22. The method of claim 19, further comprising:
 providing a mechanism for receiving control information, wherein if the control information has a first value then the LNA is configured to operate in the first mode whereas if the control information has a value then the LNA is configured to operate in the second mode.

* * * * *